(12) United States Patent
Hshieh (10) Patent No.: US 7,977,745 B2
(45) Date of Patent: Jul. 12, 2011

(54) TUNGSTEN PLUG DRAIN EXTENSION (75) Inventor: Fwu-Iuan Hshieh, Saratoga, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 76 days.

(21) Appl. No.: 12/203,941

(22) Filed: Sep. 4, 2008

(65) Prior Publication Data
US 2008/0315327 A1    Dec. 25, 2008

Related U.S. Application Data (62) Division of application No. 11/318,988, filed on Dec. 27, 2005, now Pat. No. 7,439,583.

(60) Provisional application No. 60/639,410, filed on Dec. 27, 2004.

(51) Int. Cl.
    *H01L 29/78* (2006.01)
(52) U.S. Cl. .................. 257/341; 257/401; 257/E29.257
(58) Field of Classification Search .......... 257/328–342, 257/401, 491–493, E29.257
    See application file for complete search history.

(56) References Cited

U.S. PATENT DOCUMENTS

| | | | |
|---|---|---|---|
| 4,158,206 A | 6/1979 | Neilson |
| 4,211,582 A | 7/1980 | Horng et al. |
| 4,238,278 A | 12/1980 | Antipov |
| 4,491,486 A | 1/1985 | Iwai |
| 4,895,810 A | 1/1990 | Meyer et al. |
| 4,994,406 A | 2/1991 | Vasquez et al. |
| 5,019,522 A | 5/1991 | Meyer et al. |
| 5,045,903 A | 9/1991 | Meyer et al. |
| 5,216,275 A | 6/1993 | Chen |
| 5,366,914 A | 11/1994 | Takahashi et al. |
| 5,395,790 A | 3/1995 | Lur |
| 5,432,113 A | 7/1995 | Tani |
| 5,435,888 A | 7/1995 | Kalnitsky et al. |
| 5,472,888 A | 12/1995 | Kinzor |
| 5,506,421 A | 4/1996 | Palmour |
| 5,598,018 A | 1/1997 | Lidow et al. |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 6,008,106 A | 12/1999 | Tu et al. |
| 6,081,009 A | 6/2000 | Neilson |
| 6,184,555 B1 | 2/2001 | Tihanyi et al. |
| 6,190,970 B1 | 2/2001 | Liao et al. |
| 6,198,127 B1 | 3/2001 | Kocon |

(Continued)

*Primary Examiner* — Marcos D. Pizarro
(74) *Attorney, Agent, or Firm* — Panitch Schwarze Belisario & Nadel LLP (57) ABSTRACT

A power metal-oxide-semiconductor field effect transistor (MOSFET) cell includes a semiconductor substrate. A first electrode is disposed on the semiconductor substrate. A voltage sustaining layer is formed on the semiconductor substrate. A highly doped active zone of a first conductivity type is formed in the voltage sustaining layer opposite the semiconductor substrate. The highly doped active zone has a central aperture and a channel region that is generally centrally located within the central aperture. A terminal region of the second conductivity type is disposed in the voltage sustaining layer proximate the highly doped active zone. The terminal region has a central aperture with an opening dimension generally greater than an opening dimension of the central aperture of the highly doped zone. An extension region is disposed in the voltage sustaining region within the central aperture of the highly doped active zone.

10 Claims, 12 Drawing Sheets

U.S. PATENT DOCUMENTS

| | | |
|---|---|---|
| 6,214,698 B1 | 4/2001 | Liaw et al. |
| 6,222,229 B1 | 4/2001 | Herbert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usui et al. |
| 6,452,230 B1 | 9/2002 | Boden, Jr. |
| 6,459,124 B1 | 10/2002 | Tihanyi |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,608,350 B2 | 8/2003 | Kinzer et al. |
| 6,613,644 B2 | 9/2003 | Lachner |
| 6,635,906 B1 | 10/2003 | Chen |
| 6,797,589 B2 | 9/2004 | Adams et al. |
| 6,849,880 B1 | 2/2005 | Saito et al. |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hshieh |
| 7,199,006 B2 | 4/2007 | Hshieh |
| 2004/0173844 A1* | 9/2004 | Williams et al. ............... 257/329 |
| 2004/0195618 A1* | 10/2004 | Saito et al. .................... 257/330 |
| 2006/0226494 A1 | 10/2006 | Hshieh |

* cited by examiner

TUNGSTEN PLUG DRAIN EXTENSION

CROSS-REFERENCE TO RELATED APPLICATIONS

This application is a divisional application of U.S. patent application Ser. No. 11/318,988 filed Dec. 27, 2005, currently pending, entitled "Tungsten Plug Drain Extension," which claims the benefit of U.S. Provisional Patent Application No. 60/639,410, filed Dec. 27, 2004, entitled "Tungsten Plug Drain Extension," the contents of all of which are incorporated by reference herein.

BACKGROUND OF THE INVENTION

The present invention relates to a power metal-oxide-semiconductor (MOS) device, and in particular, to a power MOS field effect transistor (FET) device having a tungsten plug drain extension.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246, the contents of all of which are incorporated herein by reference, are examples of such efforts.

U.S. Pat. No. 6,410,958 ("Usui, et al.") relates to an edge termination structure and a drift region for a semiconductor component. A semiconductor body of one conductivity type has an edge area with a plurality of regions of the other conductivity type embedded in at least two mutually different planes. Underneath an active zone of the semiconductor component, the drift regions are connected using the underlying substrate. U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. U.S. Pat. No. 6,300,171 ("Frisina") discloses a method for manufacturing an edge structure for a high voltage semiconductor device.

Figure 1A:
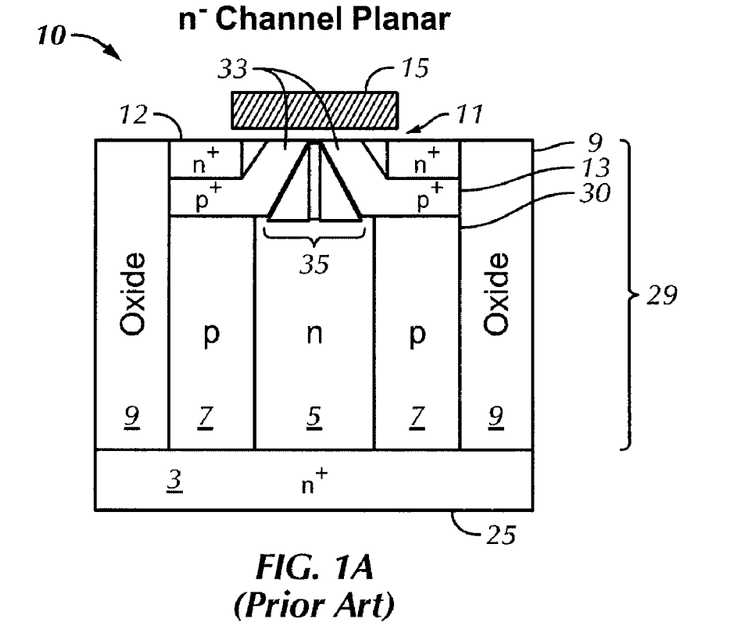
FIG. 1A is a partial sectional elevational view of a conventional n-channel planar power metal-oxide-semiconductor field effect transistor (MOSFET)

Referring to FIG. 1A, there is shown a partial elevational view of a conventional n-channel planar power MOSFET cell 10. A semiconductor substrate 3 that is part of a semiconductor device that includes a plurality of semiconductor cells 10 and a termination region 100 (see e.g., FIGS. 6-9) all of which are formed on the semiconductor substrate 3. Typically, the semiconductor substrate 3 is formed of silicon (Si). But, the semiconductor substrate 3 may be formed of other materials such as gallium arsenide (GaAs), germanium (Ge) or the like. A voltage sustaining layer 29 is formed on a surface of the semiconductor substrate 3 which includes an upper boundary formed by a heavily doped deep $p^+$ region 13. The voltage sustaining layer 29 extends to a gate oxide layer 11 via a junction field effect transistor (JFET) region 35. The voltage sustaining layer 29 includes an n-doped center region 5 that is surrounded-by a p conductivity region 7 which in turn is surrounded by an oxide or dielectric boundary 9. There is an active zone of the heavily doped deep $p^+$ region 13 on top of the voltage sustaining layer 29 that surrounds the JFET region 35. A heavily doped $n^+$ source terminal region 12 is implanted in the heavily doped deep $p^+$ region 13. The gate oxide layer 11 covers the heavily doped deep $p^+$ region 13, the heavily doped $n^+$ source regions 12, the JFET region 35 and the channel regions 33. A gate terminal 15 is positioned over the gate oxide layer 11. When an appropriate voltage is applied to the gate terminal 15, current conduction is achieved between the $n^+$ source region 12 and the $n^+$ drain that is part of the substrate 3 through channel regions 33. The JFET region 35 reduces undesirable effects from leakage current.

Figure 1B:
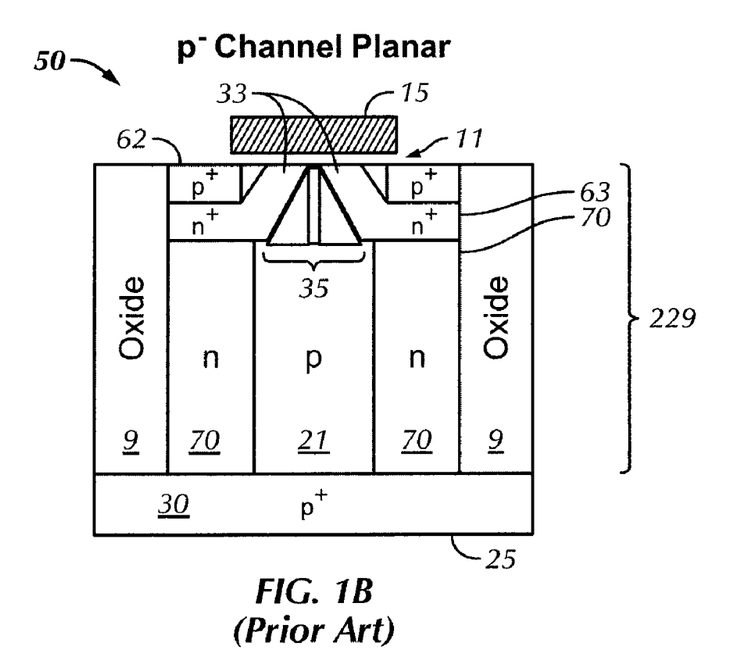
FIG. 1B is a partial sectional elevational view of a conventional p-channel planar power MOSFET.

Similarly, a sectional elevational view of a conventional p-channel planar power MOSFET cell 50 is shown in FIG. 1B. A semiconductor substrate 30 that is part of a semiconductor device that includes a plurality of semiconductor cells 50 and termination region 100 (see e.g., FIGS. 6-9) all of which are formed on the semiconductor substrate 30. There is a voltage sustaining layer 229 formed on the substrate 30 which extends from the substrate 30 through an upper boundary formed by a heavily doped deep $n^+$ region 63. The voltage sustaining layer 229 extends to a gate oxide layer 11 via a JFET region 35 as described above. The voltage sustaining layer 229 includes a p-doped center region 21 that is surrounded by an n conductivity region 70 which in turn is surrounded by an oxide or dielectric boundary 9. There is an active zone of the heavily doped deep $n^+$ region 63 on top of the voltage sustaining layer 229 that surrounds the JFET region 35. A heavily doped $p^+$ source terminal region 62 is implanted in the heavily doped deep $n^+$ region 63. A gate oxide layer 11 covers the heavily doped deep $n^+$ region 63, the heavily doped $p^+$ source regions 62, the JFET region 35 and channel regions 33. A gate terminal 15 is positioned over the oxide layer 11 so that when an appropriate voltage is applied to the terminal 15 current conduction is achieved between the $p^+$ source region 62 and the $p^+$ drain that is part of the substrate 30 through channel regions 33. The JFET region 35 reduces undesirable effects from leakage current.

Figure 2A:
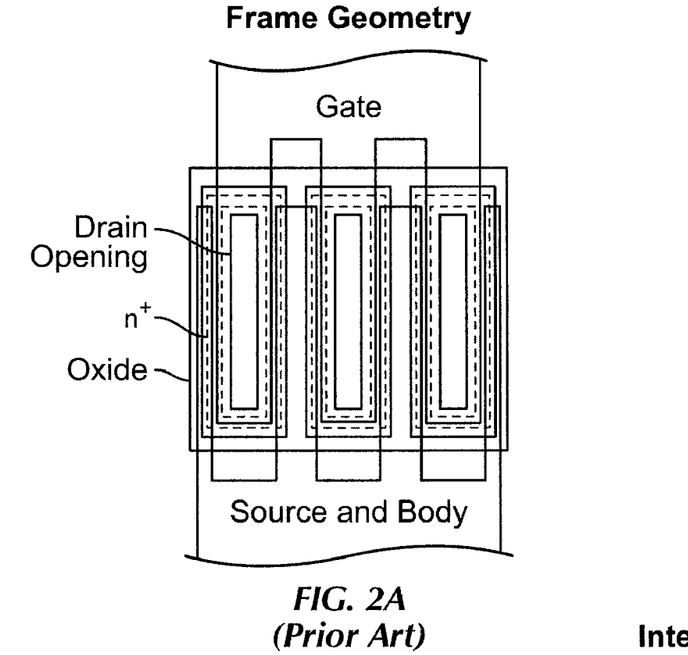
FIG. 2A is a partial top plan view of a conventional planar power MOSFET having a frame geometry.
Figure 2B:
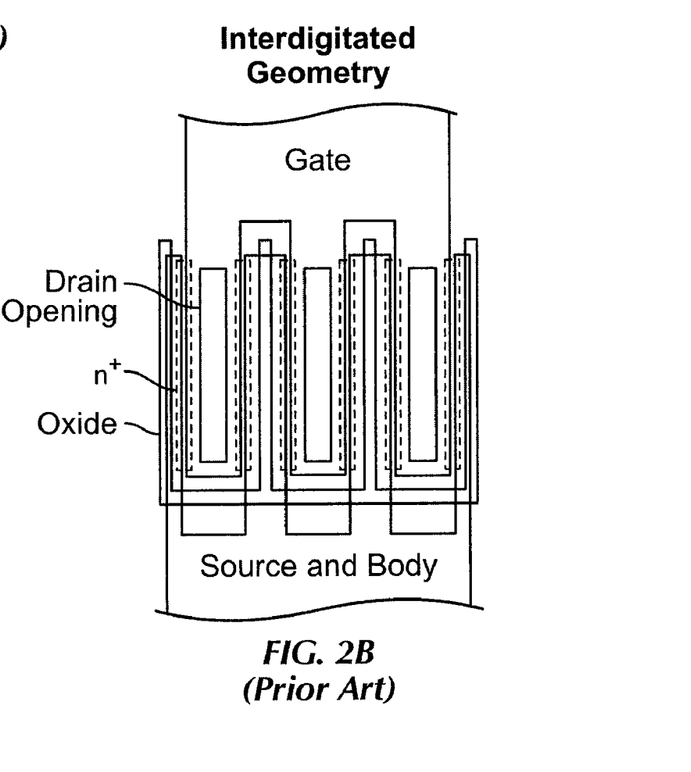
FIG. 2B is a partial top plan view of a conventional planar power MOSFET having an interdigitated geometry.

FIG. 2A is a partial top plan view of a conventional planar power MOSFET of the type described above having a frame geometry. FIG. 2B is a partial top plan view of a conventional planar power MOSFET of the type described above having an interdigitated geometry.

It is desirable to provide a method of manufacturing a superjunction semiconductor device having a tungsten plug drain extension, as well as the resultant device formed therefrom.

BRIEF SUMMARY OF THE INVENTION

Briefly stated, the present invention comprises a power metal-oxide-semiconductor field effect transistor (MOSFET) cell. In one embodiment the power MOSFET cell includes a semiconductor substrate having first and second main surfaces opposite to each other. A first electrode is disposed on the first main surface of the semiconductor substrate. A voltage sustaining layer is formed on the second main surface of the semiconductor substrate. The voltage sustaining layer includes a first region of a first conductivity type and a second region of a second conductivity type. The second conductivity type is opposite to the first conductivity type. A highly doped active zone of the first conductivity type is formed in the voltage sustaining layer opposite the semiconductor substrate. The highly doped active zone has a central aperture and a channel region that is generally centrally located within the central aperture. The voltage sustaining layer includes the channel region of the first conductivity type. A terminal region which is ideally polygonal-shaped or continuously curvilinear-shaped of the second conductivity type is disposed in the voltage sustaining layer proximate the highly doped active zone. The terminal region has a central aperture ideally with an opening dimension generally greater than an opening dimension of the central aperture of the highly doped zone. An extension region is disposed in the voltage sustaining region at least partially within the central aperture of the highly doped active zone.

Additional embodiments comprise a power MOSFET cell that includes a semiconductor substrate having first and second main surfaces opposite to each other. A first electrode is disposed on the first main surface of the semiconductor substrate. A voltage sustaining layer is formed on the second main surface of the semiconductor substrate. The voltage sustaining layer includes a first region of a first conductivity type and a second region of a second conductivity type. The second conductivity type is opposite to the first conductivity type. A highly doped active zone of the first conductivity type is formed in the voltage sustaining layer opposite the semiconductor substrate. The highly doped active zone ideally has a striped shape with a central aperture and a channel region located within the central aperture. The voltage sustaining layer includes the channel region of the first conductivity type and a region of the second conductivity type surrounding the channel region. A stripe-shaped terminal region of the second conductivity type is disposed in the voltage sustaining layer proximate the highly doped active zone. The stripe-shaped terminal region has a central aperture ideally with an opening dimension generally greater than an opening dimension of the central aperture of the highly doped zone. An extension region is disposed in the voltage sustaining region at least partially within the central aperture of the highly doped active zone.

A power MOSFET of the first geometry type contains one or more cells with a highly doped semiconductor substrate of a first conductivity type at a first main surface.

The power MOSFET includes an insulating pillar that surrounds the voltage sustaining layer. Additionally, there is an insulating layer on a portion of the polygonal-shaped source region and the gate electrode is surrounded by insulator. This geometry is often referred to as a "frame" geometry.

The voltage sustaining layer includes a drain extension formed in a trench below the gate region. The drain extension may be a highly doped semiconductor zone of the second conductivity type, a trench with "out-diffused" dopant of the second conductivity type and filled with one of polycrystalline and monocrystalline silicon, or a trench at least partially filled with a metal such as tungsten. The drain extension extends only part way through the voltage sustaining layer.

A power MOSFET of the second geometry or interdigitated type, having no central aperture, is completely surrounded by a heavily doped active zone of the first conductivity type with its associated insulating pillar.

A power MOSFET device of either geometry is surrounded by an edge termination region.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an," as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 1C:
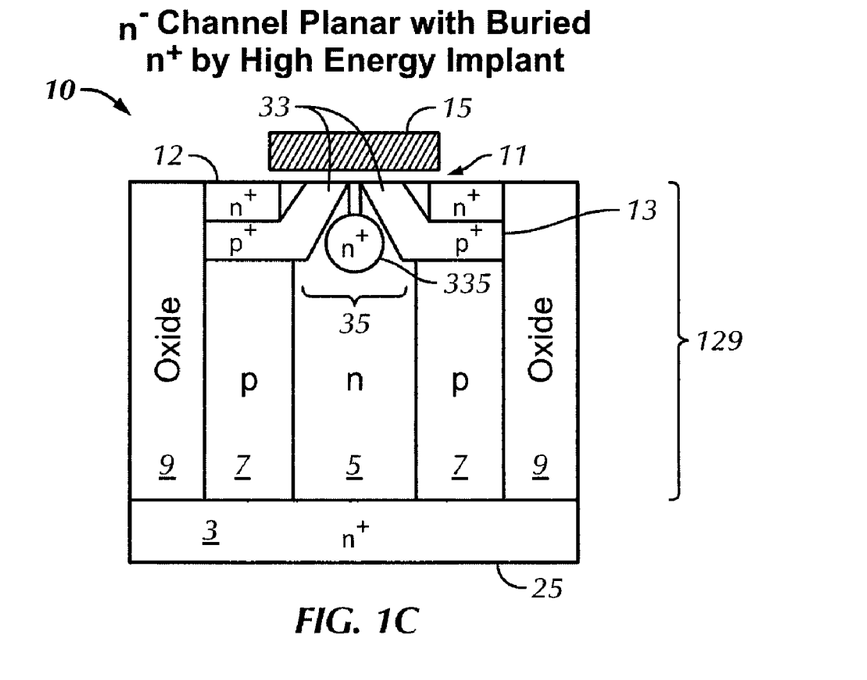
FIG. 1C is a partial sectional elevational view of an n-channel planar power MOSFET having a buried high energy implant.

Referring to the drawings in detail, wherein like numerals represent like elements throughout, FIG. 1C illustrates an n-channel planar power MOSFET cell 10 similar to the MOSFET cell 10 of FIG. 1A but with an embedded $n^+$ region 335 in the JFET region 35. The power MOSFET cell 10 includes a semiconductor substrate 3 having first and second main surfaces opposite to each other. A first electrode 25 is disposed on the first main surface of the semiconductor substrate 3. A voltage sustaining layer 129 is formed on the second main surface of the semiconductor substrate 3. The voltage sustaining layer 129 includes a first region 7 of a first conductivity type and a second region 5 of a second conductivity type. The second conductivity type (e.g., n-type) is opposite to the first conductivity type (e.g., p-type). For example, the voltage sustaining layer 129 includes an n region 5 that is surrounded by a p region 7. A highly doped active zone 13 of the first conductivity type is formed in the voltage sustaining layer 129 opposite the semiconductor substrate 3. The highly doped active zone 13 has one of a polygonal and a continuously curvilinear shape (see FIGS. 4 and 9) with a central aperture and a channel region 33 that is centrally located within the central aperture. The voltage sustaining layer 129 includes the channel region 33 of the first conductivity type and a source terminal region 12 of the second conductivity type surrounding the channel region 33. The terminal region 12 of the second conductivity type may be polygonally-shaped or continuously curvilinearly-shaped and is disposed in the voltage sustaining layer 129 proximate the highly doped active zone 13. The embodiments may comprise other non-geometrically shaped terminal regions 12 without departing from the invention. The source terminal region 12 has a central aperture with an opening dimension generally greater than an opening dimension of the central aperture of the highly doped zone 13. An extension region 335 is disposed in the voltage sustaining region 129 at least partially within the central aperture of the highly doped active zone 13. The extension region 335 is generally located in the JFET region 35. There is an oxide or dielectric boundary 9 located between each cell 10 of a plurality of cells 10. The oxide region 9 surrounds the voltage sustaining layer 129.

Figure 6:
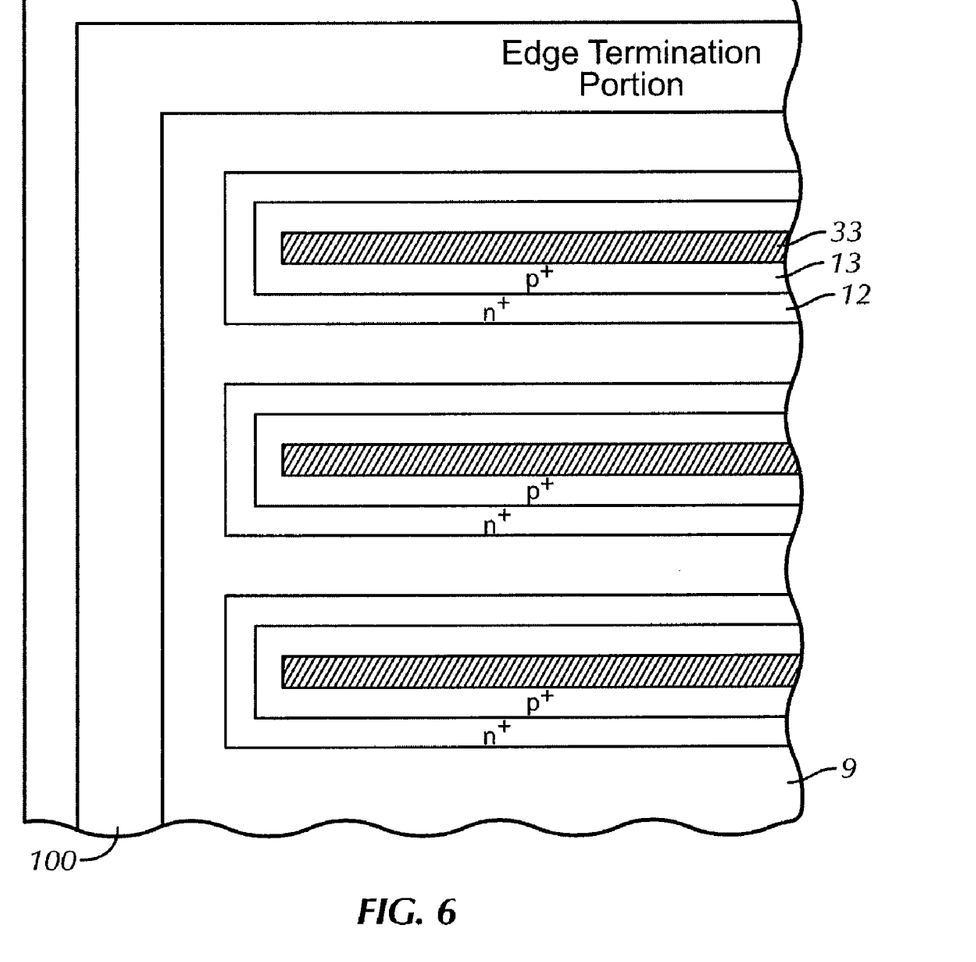
FIG. 6 is a partial top plan view of a power MOSFET having striped-rectangle cell geometry.

Alternatively, the highly doped active zone 13 has a striped shape with a central aperture and the source terminal region 12 of the second conductivity type is stripe-shaped (see FIG. 6).

Figure 1D:
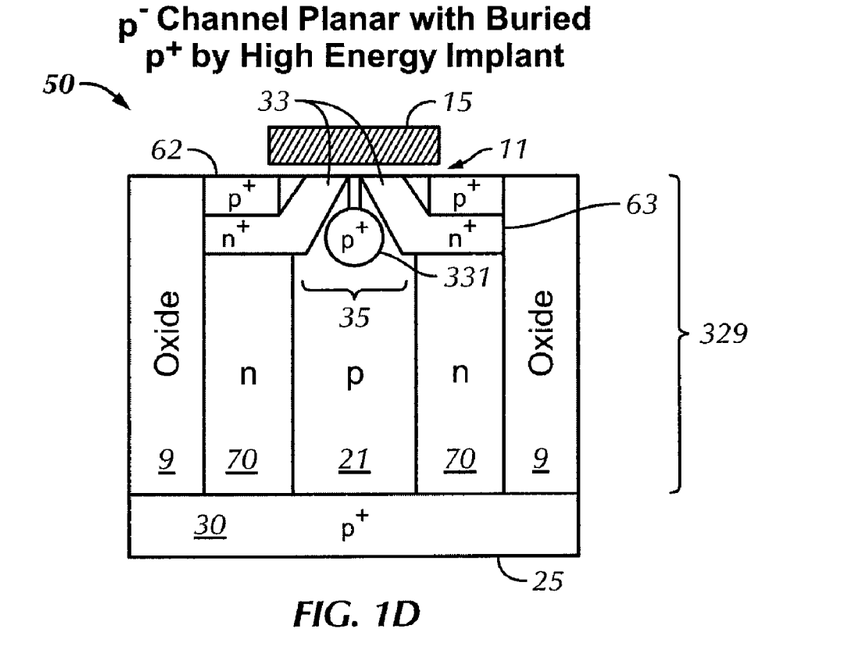
FIG. 1D is a partial sectional elevational view of a p-channel planar power MOSFET having a buried high energy implant.

FIG. 1D illustrates a p-channel planar power MOSFET 50 similar to the MOSFET cell 50 of FIG. 1B but with an embedded p+ region 331 in the JFET region 35. The power MOSFET cell 50 includes a semiconductor substrate 30 having first and second main surfaces opposite to each other. A first electrode 25 is disposed on the first main surface of the semiconductor substrate 30. A voltage sustaining layer 329 is formed on the second main surface of the semiconductor substrate 30. The voltage sustaining layer 329 includes a first region 70 of a first conductivity type and a second region 21 of a second conductivity type. The second conductivity type (e.g., p-type) is opposite to the first conductivity type (e.g., n-type). For example, the voltage sustaining layer 329 includes a p region 21 that is surrounded by an n region 70. A highly doped active zone 63 of the first conductivity type is formed in the voltage sustaining layer 329 opposite the semiconductor substrate 3. The highly doped active zone 63 has one of a polygonal and a continuously curvilinear shape (see FIGS. 4 and 9) with a central aperture and a channel region 33 that is centrally located within the central aperture. The voltage sustaining layer 329 includes the channel region 33 of the first conductivity type and a source terminal region 62 of the second conductivity type surrounding the channel region 33. The terminal region 62 of the second conductivity type may be polygonal-shaped or continuously curvilinearly-shaped and is disposed in the voltage sustaining layer 329 proximate the highly doped active zone 63. The source terminal region 62 has a central aperture with an opening dimension generally greater than an opening dimension of the central aperture of the highly doped zone 63. An extension region 331 is disposed in the voltage sustaining region 329 at least partially within the central aperture of the highly doped active zone 63. The extension region 331 is generally located in the JFET region 35. There is an oxide or dielectric boundary 9 located between each cell 50 of a plurality of cells 50. The oxide region 9 surrounds the voltage sustaining layer 329.

Alternatively, the highly doped active zone 63 has a striped shape with a central aperture, and the source terminal region 62 of the second conductivity type is stripe-shaped (see FIG. 6).

All of the embodiments described herein may be oriented or configured as "frame" geometry or interdigitated (striped) geometry. Further, all of the embodiments include a similar substrate 3, and voltage sustaining layer 129, 329, depending on whether they are n-type or p-type, respectively.

Figure 3A:
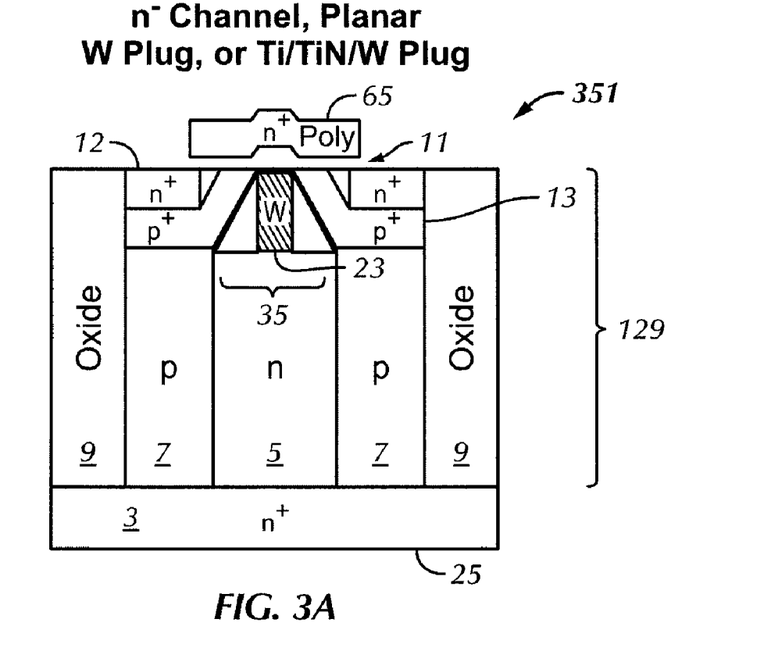
FIG. 3A is a partial sectional elevational view of an n-channel planar power MOSFET having a tungsten plug drain extension in accordance with a preferred embodiment of the present invention.

FIG. 3A shows another embodiment of the present invention which is similar to the MOSFET of FIG. 1A. An n-channel planar power MOSFET cell 351 has an extension region or metal plug 23 disposed in the JFET region 35 that extends from the oxide layer 11 to the n region 5. The metal plug 23 may be formed of tungsten (W), titanium (Ti), titanium nitrogen ($Ti_xN_y$) combinations, titanium-tungsten combinations or the like. The MOSFET cell 351 includes a polysilicon gate conductor 65 that is heavily doped $n^+$. There is an oxide or dielectric boundary 9 located between each cell 351 of a plurality of cells 351.

Figure 3B:
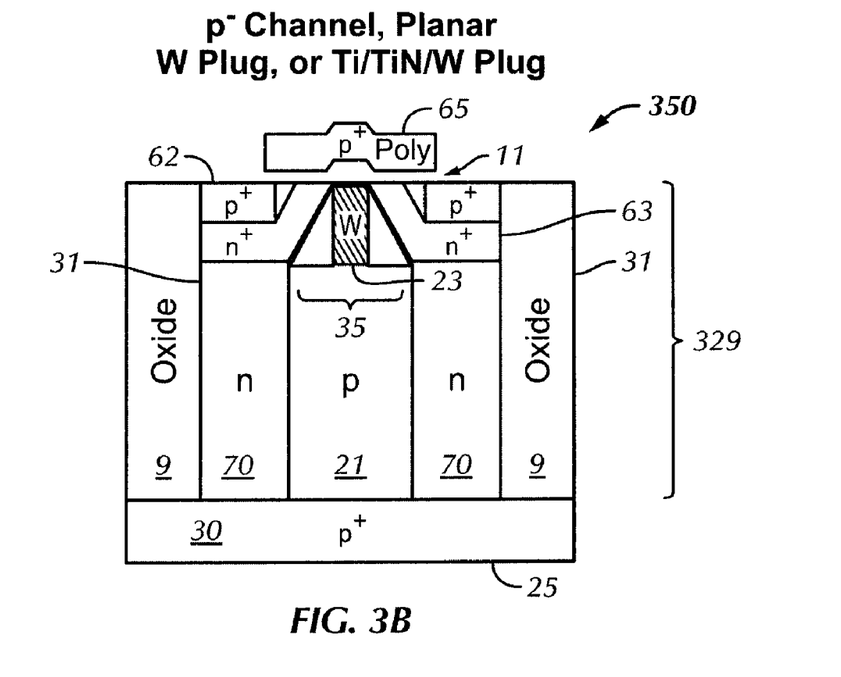
FIG. 3B is a partial sectional elevational view of a p-channel planar power MOSFET having a tungsten plug drain extension in accordance with a preferred embodiment of the present invention.

FIG. 3B, which is similar to FIG. 3A, shows a p-channel planar power MOSFET cell 350 having an extension or metal plug 23 disposed in the JFET region 35 that extends between the oxide layer 11 to the p region 21. The metal plug 23 may be formed of tungsten, titanium, titanium nitrogen combinations, titanium-tungsten combinations or the like. The power MOSFET cell 350 includes a polysilicon gate conductor 65 of heavy doped $p^+$. There is an oxide or dielectric boundary 9 located between each cell 350 of the plurality of cells 350.

Figure 3C:
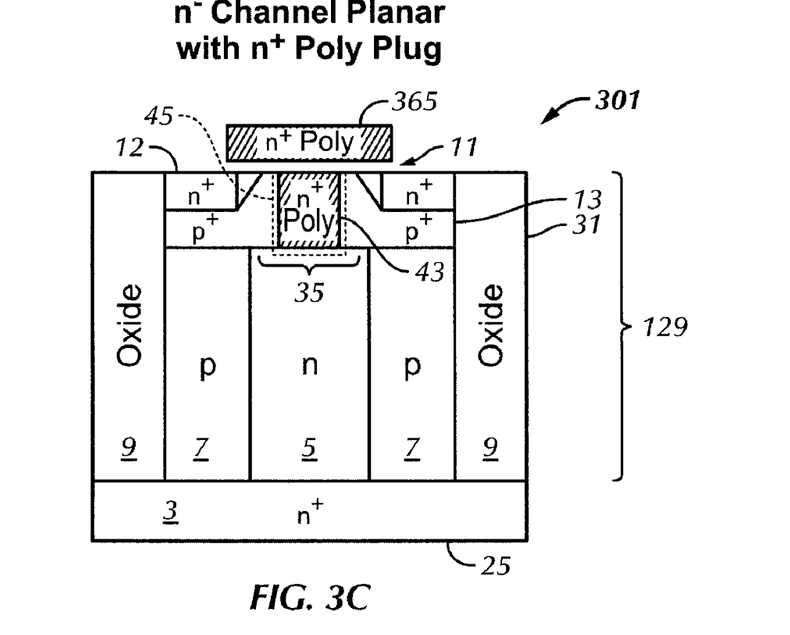
FIG. 3C is a partial sectional elevational view of an n-channel planar power MOSFET having a doped polysilicon plug drain extension in accordance with a preferred embodiment of the present invention.

FIG. 3C shows another embodiment of the present invention. An n-channel planar power MOSFET cell 301 includes an extension region or plug 43 that comprises a trench filled with polycrystalline or monocrystalline silicon doped with an n-type dopant. The extension region trench 43 may be partially filled or lined with a dielectric or insulator 45 similar to the liner 45, shown in FIGS. 3E and 3G.

Figure 3D:
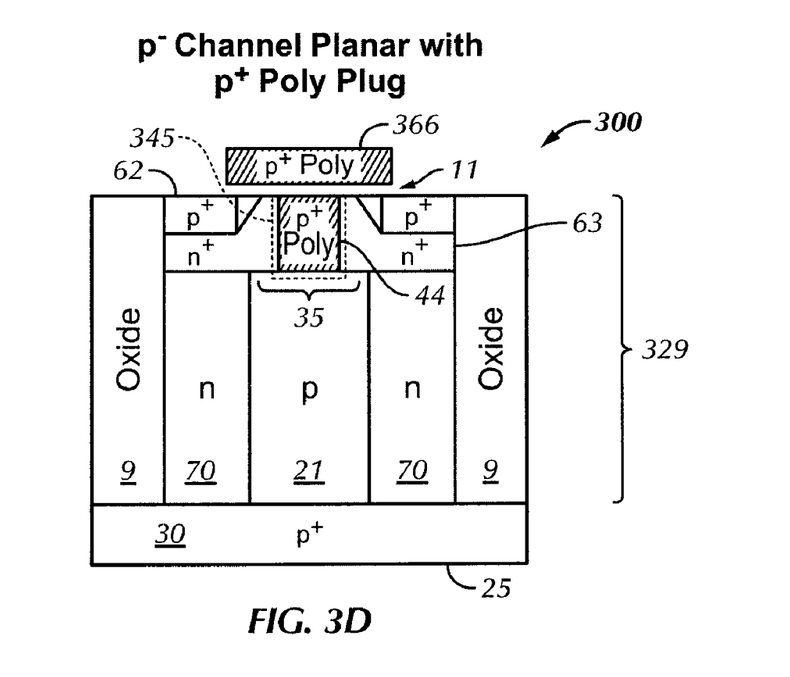
FIG. 3D is a partial sectional elevational view of a p-channel planar power MOSFET having a doped polysilicon plug drain extension in accordance with a preferred embodiment of the present invention.

FIG. 3D, which is similar to FIG. 3C, shows a p-channel planar power MOSFET cell 300 includes an extension region or plug 44 provided that comprises a trench filled with polycrystalline or monocrystalline silicon doped with p-type dopant. The extension region trench 44 may be partially filled or lined with a dielectric or insulator 345, similar to the liner 345 shown in FIGS. 3F and 3H.

Figure 3E:
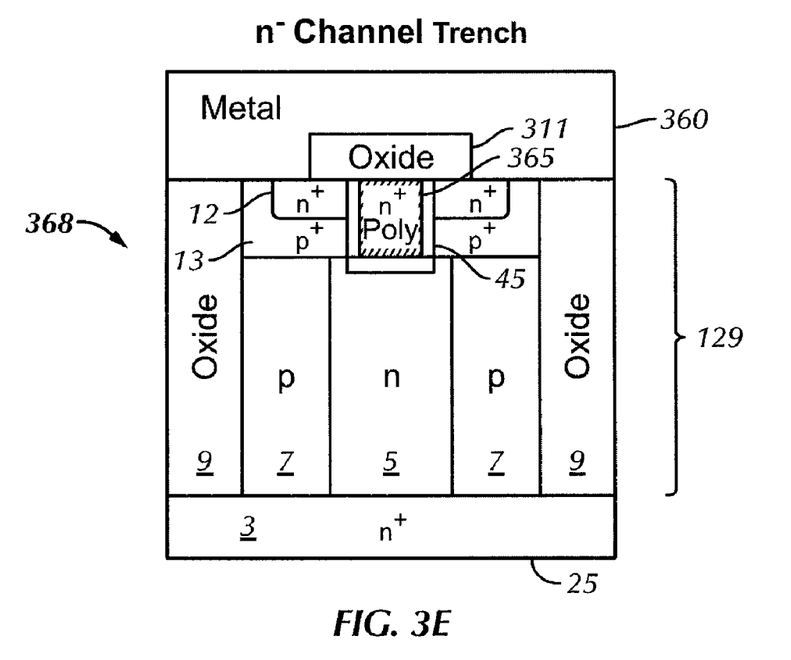
FIG. 3E is a partial sectional elevational view of a trench n-channel power MOSFET having a doped polysilicon filled trench in accordance with a preferred embodiment of the present invention.

FIG. 3E shows another embodiment of the present invention. A trench n-channel power MOSFET cell 368 includes a substrate portion 3 and a voltage sustaining layer 129. There is an oxide layer 311 over at least the cell portion where a gate conductor 365 is located. Gate conductor 365 is formed in the manner described above with respect to the extension region or plug 43 of FIG. 3C and is surrounded on its sides and bottom by gate oxide 45. A metal layer 360 contacts the p$^+$ body and the n$^+$ source. There is an oxide boundary 9 located between each cell of the plurality of cells.

Figure 3F:
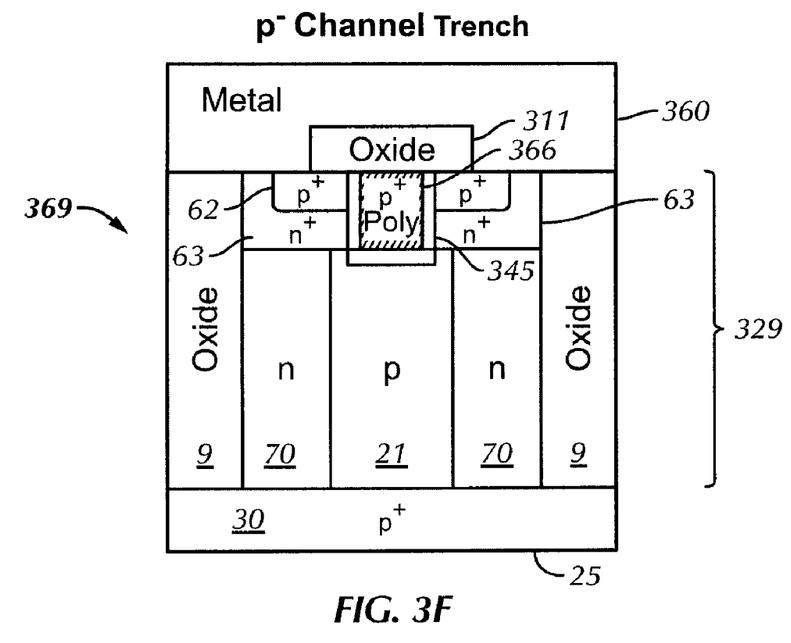
FIG. 3F is a partial sectional elevational view of a trench p-channel power MOSFET having a doped polysilicon filled trench in accordance with a preferred embodiment of the present invention.

FIG. 3F, which is similar to FIG. 3E, shows a trench p-channel power MOSFET cell 369 having a substrate portion 30 on which there is a voltage sustaining layer 329 positioned. The voltage sustaining layer 329 includes a p region 21 that is surrounded by an n region 70. On top of the voltage sustaining layer 329 there is an active layer of a heavily doped deep n$^+$ region 63 in which a p$^+$ source region 62 is located. There is an oxide layer 311 over at least the cell portion on which a gate conductor 366 is located. Gate conductor 366 is formed in the manner described above with respect to the extension region or plug 44 of FIG. 3D and is surrounded on its sides and bottom by gate oxide 345. A metal layer 360 contacts the n$^+$ body and the p$^+$ source. There is an oxide boundary 9 located between each cell of the plurality of cells.

Figure 3G:
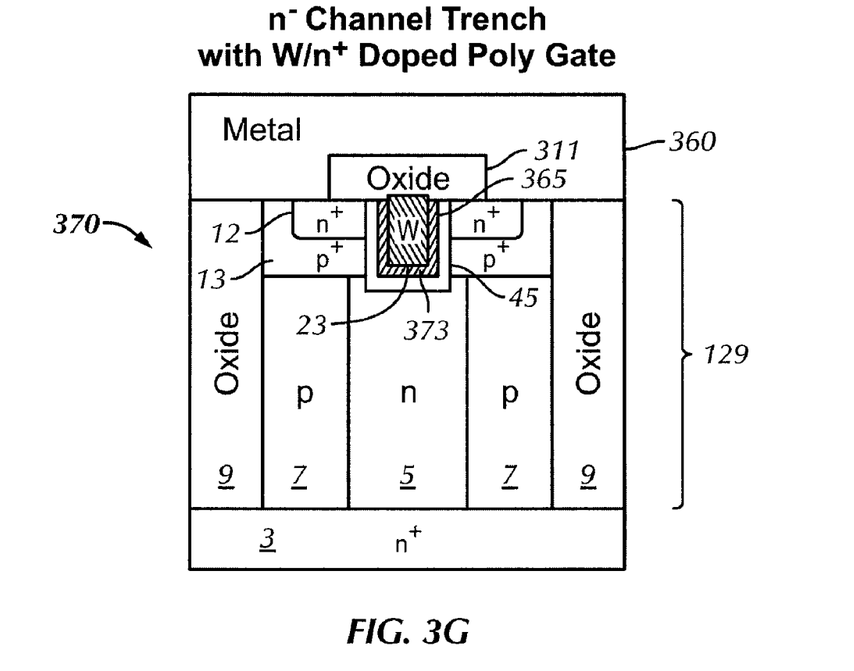
FIG. 3G is a partial sectional elevational view of a trench n-channel power MOSFET having a doped polysilicon filled trench and a tungsten plug drain extension in accordance with a preferred embodiment of the present invention.

FIG. 3G shows another embodiment of the present invention. A trench n-channel power MOSFET cell 370 includes a substrate portion 3 and a voltage sustaining layer 129 positioned. The voltage sustaining layer 129 includes an n region 5 that is surrounded by a p region 7. On top of the voltage sustaining layer 129 there is an active layer of a heavily doped deep p$^+$ region 13 in which n$^+$ source region 12 is located. There is an oxide layer 311 over at least the cell portion where a gate conductor 365 is located. Gate conductor 365 is formed in the manner described above with respect to the extension region or plug 43 of FIG. 3C and is surrounded on its sides and bottom by gate oxide 45. A metal layer 360 contacts the p$^+$ body 13 and the n$^+$ source 12. There is an oxide boundary 9 located between each cell of the plurality of cells. There is a metal plug 23, such as a tungsten, titanium; a titanium nitrogen combination or a titanium tungsten combination located in the gate conductor 365 to minimize the gate resistance of the n$^+$ doped polysilicon 373.

Figure 3H:
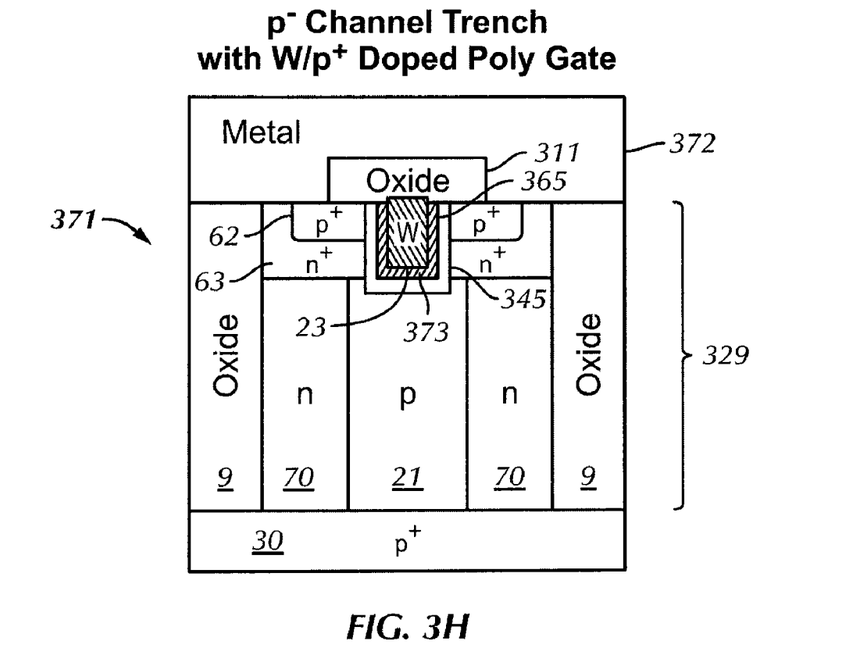
FIG. 3H is a partial sectional elevational view of a trench p-channel power MOSFET having a doped polysilicon filled trench and a tungsten plug drain extension in accordance with a preferred embodiment of the present invention.

FIG. 3H, which is similar to FIG. 3G, shows a trench p-channel power MOSFET cell 371 which includes a-substrate portion 30 on which there is a voltage sustaining layer 329. The voltage sustaining layer 329 includes a p region 21 that is surrounded by an n region 70. On top of the voltage sustaining layer 329 there is an active layer of a heavily doped deep n$^+$ region 63 in which a p$^+$ source region 62 is located. There is an oxide layer 311 over at least the cell portion on which a gate conductor 365 is located. There is an oxide boundary 9 located between each cell of the plurality of cells. There is a metal plug 23, such as a tungsten, titanium, a titanium nitrogen combination or a titanium tungsten combination located in the gate conductor 365 which reduces the gate resistance of the p$^+$ doped polysilicon 373.

Figure 4:
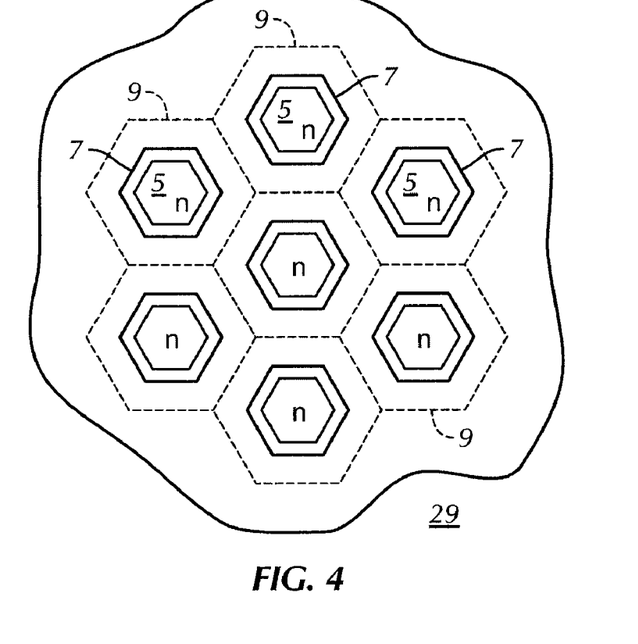
FIG. 4 is a partial top plan view of a power MOSFET having hexagonal cell geometry.

Referring to FIG. 4, any of the standard types of geometry may be used with the disclosed embodiments of FIGS. 1C-1D and 3A-3H. The top plan view geometries include, but are not limited to, hexagonals (FIG. 4), squares (FIG. 5), or rectangular stripes (FIG. 6). In FIG. 4, the voltage sustaining layer 129 includes a plurality of dielectric pillars 9 in which there is formed an n region 5 that is surrounded by a p region 7. Similarly, referring to FIG. 5, the square geometry is shown, where the dielectric regions 9 are pillars that isolate each cell that includes an n region 5 surrounded by a p region 7. Of course, the other voltage sustaining layer 329 could be similarly implemented.

FIG. 6 is a rectangular stripe design that illustrates the gate channel 33 surrounded by the deep p region 13 in which the n$^+$ source region 12 is located. Surrounding each cell is a dielectric region 9 and all of the cells are surrounded by an edge termination region 100. Of course, the other voltage sustaining layer 329 could be similarly implemented.

Figure 5:
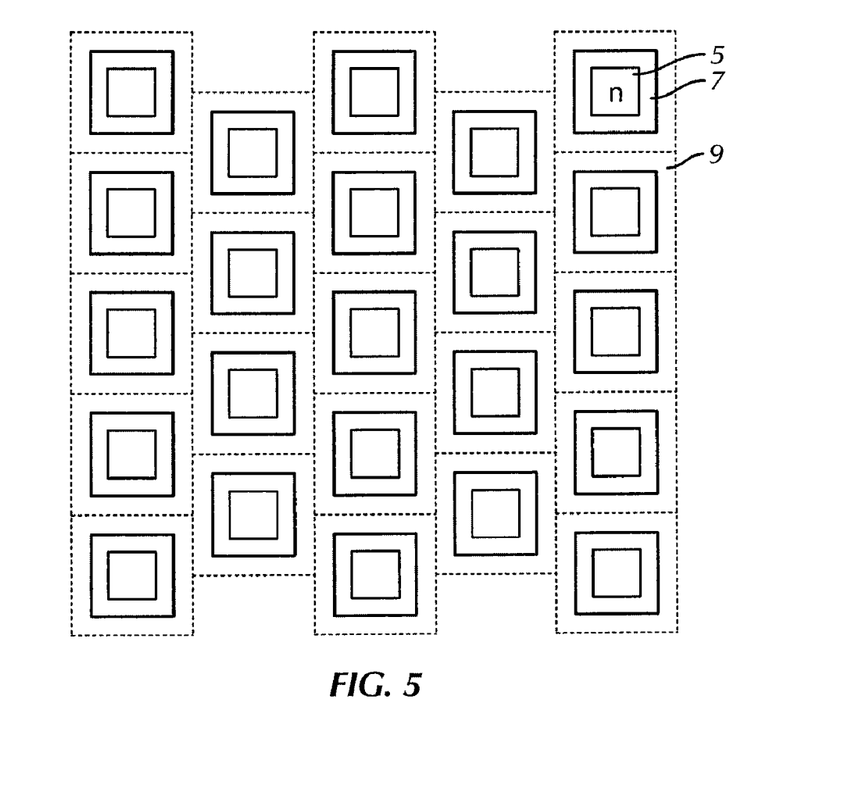
FIG. 5 is a partial top plan view of a power MOSFET having patterned square cell geometry.
Figure 7:
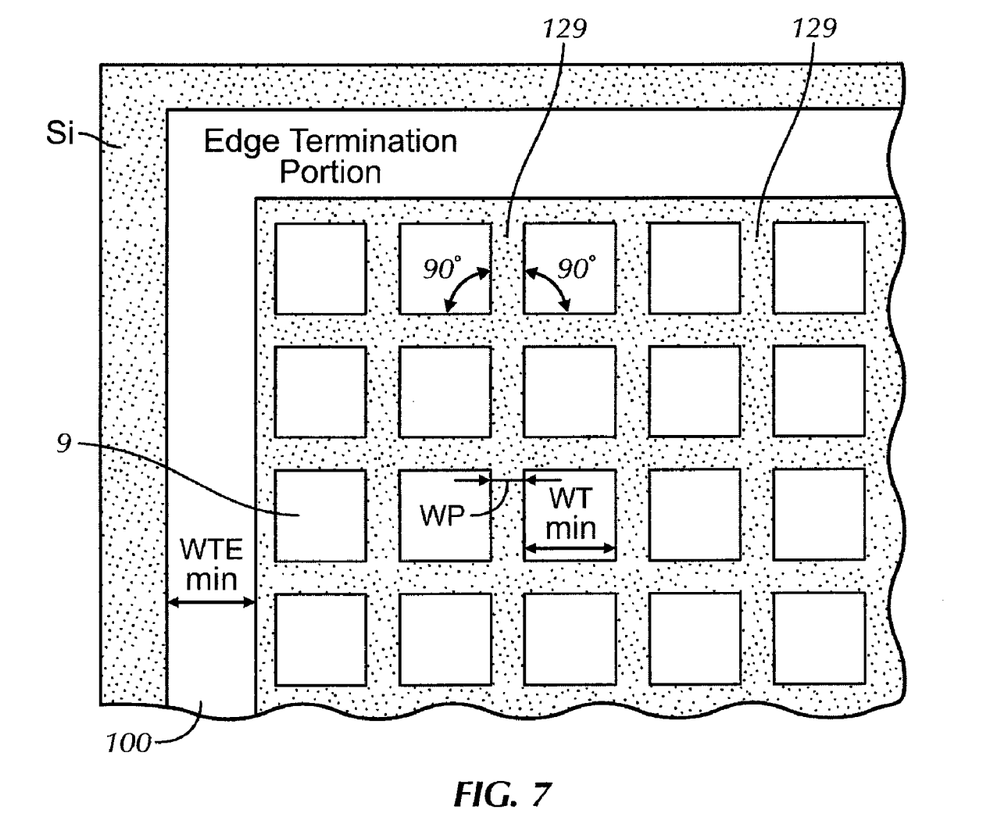
FIG. 7 is a partial top plan view of the power MOSFET having patterned square cell geometry of FIG. 5 including cell isolation regions.

FIG. 7 shows the planar pattern including the cell isolation regions 9, p-n-p voltage sustaining layer pillars 129 and edge termination isolation region 100 for a frame geometry that is the inverse of the pattern in FIG. 5. The planar pattern of the cell isolation region 9 is rectangular (e.g., square). The conductive pillars form a mesh, and are pattern sandwiched between the cell isolation regions 9 with intersecting portions of the mesh having an intersecting angle of 90°. Any cellular geometry can be "reversed" to become a "mesh" geometry.

Since the p-n-p voltage sustaining layer pillar region 129 is ideally entirely formed in the mesh pattern, a density of the p-n-p voltage sustaining layer pillar region 129 per unit area can be raised, and the on-resistance $R_{ON}$ can be reduced. Additionally, it is believed that compared with the MOSFET having the stripe pattern of FIG. 6, the density of the p-n-p voltage sustaining layer pillar 129 is about double, and $R_{ON}$ decreases by 40% or more.

Figure 8:
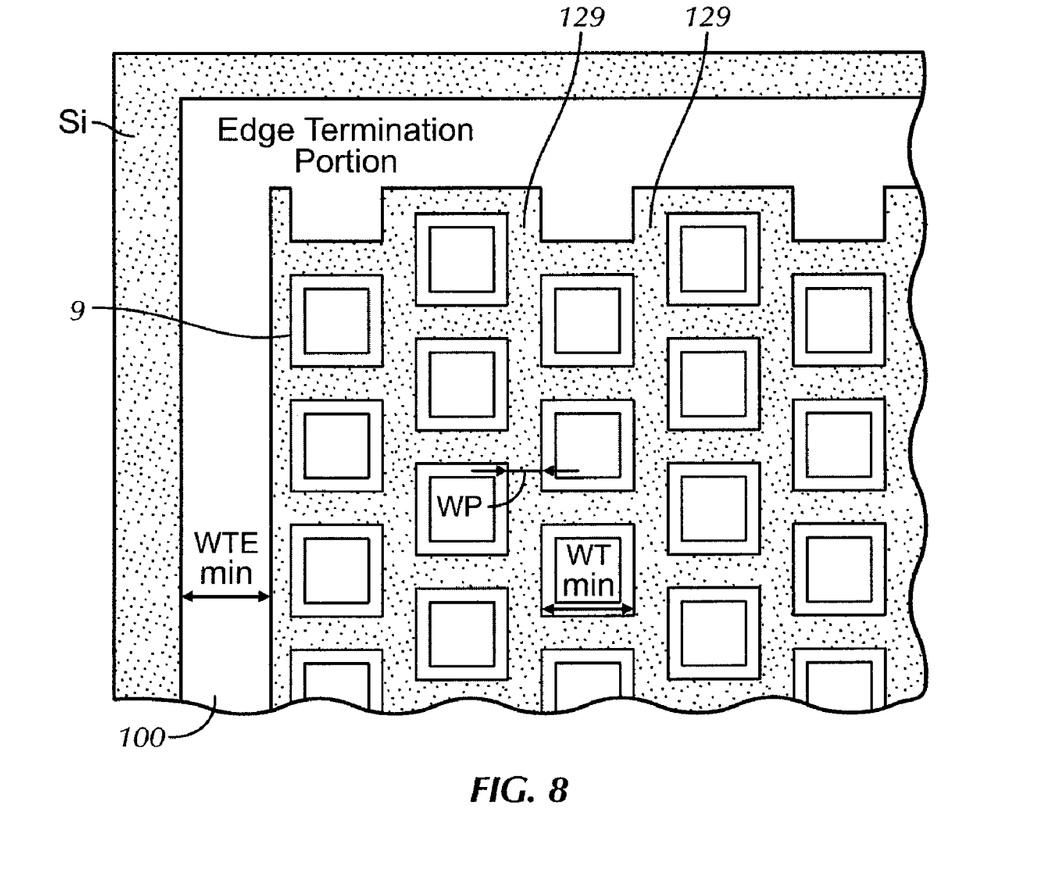
FIG. 8 is a partial top plan view of the power MOSFET having an alternate patterned square cell geometry of FIG. 5 including cell isolation regions.
Figure 9:
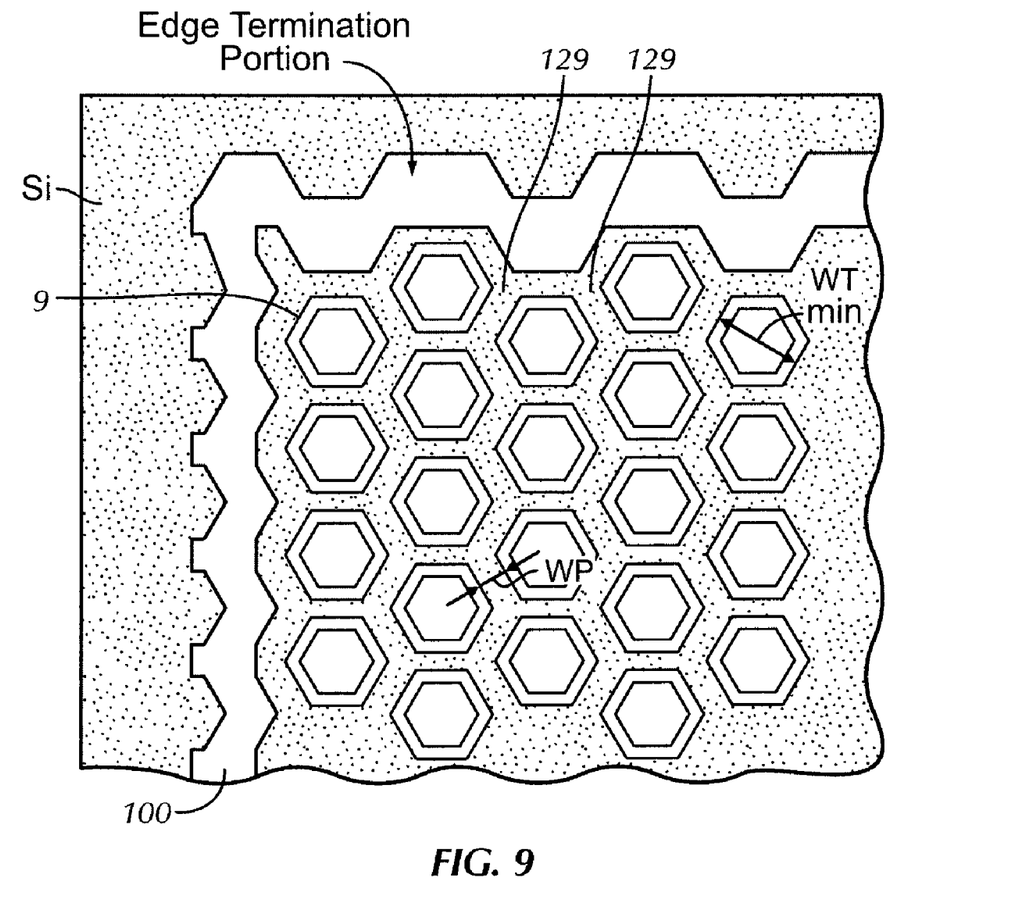
FIG. 9 is a partial top plan view of the power MOSFET having hexagonal cell geometry of FIG. 4 including cell isolation regions.

FIG. 8 shows an alternate planar pattern including rectangular cell isolation regions 9, p-n-p voltage sustaining layer pillars 129, and edge termination isolation region 100 for a frame geometry that is the inverse of the pattern in FIG. 5. FIG. 9 illustrates a planar pattern including hexagonal cell isolation regions 9, p-n-p voltage sustaining layer pillars 129, and edge termination isolation region 100 for a frame geometry that is the inverse of the pattern in FIG. 4.

In a MOSFET having an extension region in accordance with the embodiments of the present invention, JFET resistance is reduced or eliminated which allows a reduction of on-resistance RON.

From the foregoing, it can be seen that the present invention is directed to a high voltage semiconductor device having a tungsten plug drain extension. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit. Although, in some instances, explicit dimensions have been set forth above, it would be understood that feature sizes of less than those specified above could be employed using other fabrication techniques and certainly larger feature sizes could be employed when, e.g., there is a need for greater power handling.

I claim:

1. A power metal-oxide-semiconductor field effect transistor (MOSFET) cell comprising:
   a semiconductor substrate having first and second main surfaces opposite to each other;
   a first electrode disposed on the first main surface of the semiconductor substrate;
   a voltage sustaining layer formed on the second main surface of the semiconductor substrate, the voltage sustaining layer including a first region of a first conductivity type extending to the second main surface of the semiconductor substrate and a second region of a second conductivity type extending to the second main surface of the semiconductor substrate, the second conductivity type being opposite to the first conductivity type, the voltage sustaining layer being surrounded by a dielectric region extending to the second main surface of the semiconductor substrate;

a highly doped active zone of the first conductivity type formed in the voltage sustaining layer opposite the semiconductor substrate, the highly doped active zone having a striped shape with a generally central aperture and a channel region being generally centrally located within the central aperture, the voltage sustaining layer including the channel region;

a stripe-shaped terminal region of the second conductivity type disposed in the voltage sustaining layer proximate the highly doped active zone, the stripe-shaped terminal region having a central aperture; and an extension region disposed in the voltage sustaining region at least partially within the central aperture of the highly doped active zone.

2. The power MOSFET cell according to claim 1, wherein the extension region includes a highly doped semiconductor of the second conductivity type.

3. The power MOSFET cell according to claim 1, wherein the extension region includes a gate connection formed in a trench in the channel region.

4. The power MOSFET cell according to claim 1, further comprising:
   a gate electrode above the channel region and extending across the central aperture of the stripe-shaped terminal region; and
   a gate insulator layer on the stripe-shaped terminal region, the gate electrode being formed in the gate insulator layer.

5. The power MOSFET cell according to claim 1, wherein the central aperture of the stripe-shaped terminal region has an opening dimension generally greater than an opening dimension of the central aperture of the highly doped active zone.

6. The power MOSFET cell according to claim 1, wherein the extension region includes a trench at least partially filled with a metal.

7. The power MOSFET cell according to claim 6, wherein the metal is tungsten.

8. The power MOSFET cell according to claim 1, wherein the extension region includes a trench filled with one of polycrystalline silicon and monocrystalline silicon.

9. The power MOSFET cell according to claim 8, wherein an interior of the trench is lined with an insulator.

10. The power MOSFET cell according to claim 9, wherein the insulator is formed with a cavity.

* * * * *